(12) United States Patent
Li et al.

(10) Patent No.: US 10,373,930 B2
(45) Date of Patent: Aug. 6, 2019

(54) PACKAGE STRUCTURE AND THE METHOD TO FABRICATE THEREOF

(75) Inventors: Jeng-Jen Li, Taipei (TW); Bau-Ru Lu, Changhua County (TW)

(73) Assignee: CYNTEC CO., LTD, Hsinchu (TW)

( * ) Notice: Subject to any disclaimer, the term of this patent is extended or adjusted under 35 U.S.C. 154(b) by 439 days.

(21) Appl. No.: 13/571,378

(22) Filed: Aug. 10, 2012

(65) Prior Publication Data
US 2014/0042610 A1    Feb. 13, 2014

(51) Int. Cl.
| *H01L 23/48* | (2006.01) |
| *H01L 25/065* | (2006.01) |
| *H01L 23/00* | (2006.01) |
| *H01L 23/13* | (2006.01) |
| *H01L 23/538* | (2006.01) |
| *H01L 25/16* | (2006.01) |
| *H01L 23/498* | (2006.01) |

(52) U.S. Cl.
CPC .......... *H01L 25/0652* (2013.01); *H01L 23/13* (2013.01); *H01L 23/5389* (2013.01); *H01L 24/19* (2013.01); *H01L 24/20* (2013.01); *H01L 24/24* (2013.01); *H01L 24/82* (2013.01); *H01L 23/49816* (2013.01); *H01L 25/16* (2013.01); *H01L 2224/0401* (2013.01); *H01L 2224/04105* (2013.01); *H01L 2224/16145* (2013.01); *H01L 2224/16225* (2013.01); *H01L 2224/16227* (2013.01); *H01L 2224/244* (2013.01); *H01L 2224/24101* (2013.01); *H01L 2224/24155* (2013.01); *H01L 2224/2518* (2013.01); *H01L 2924/12042* (2013.01); *H01L 2924/13055* (2013.01); *H01L 2924/13091* (2013.01); *H01L 2924/15787* (2013.01)

(58) Field of Classification Search
CPC ..... H01L 23/48; H01L 21/50; H01L 25/0652; H01L 24/82; H01L 24/24; H01L 24/20; H01L 23/13; H01L 23/5389; H01L 24/19; H01L 2924/12042; H01L 2224/16225; H01L 2924/15787; H01L 2224/0401; H01L 2924/13055; H01L 2924/13091; H01L 2224/2518; H01L 2224/244; H01L 2224/16227; H01L 2224/16145; H01L 2224/04105; H01L 2224/24155; H01L 2224/24101; H01L 23/49816; H01L 25/16
USPC .................................. 257/686, 777, 778, 723
See application file for complete search history.

(56) References Cited

U.S. PATENT DOCUMENTS

| 3,881,884 | A | * | 5/1975 | Cook | ........................ H01B 1/00 216/13 |
| 5,172,212 | A | * | 12/1992 | Baba | ................. H01L 23/53223 257/738 |
| 5,796,591 | A | * | 8/1998 | Dalal et al. | .................... 361/779 |
| 6,657,311 | B1 | * | 12/2003 | Hortaleza et al. | ............. 257/778 |
| 7,674,651 | B2 | * | 3/2010 | Oyama et al. | ................. 438/106 |

(Continued)

*Primary Examiner* — Cuong B Nguyen
(74) *Attorney, Agent, or Firm* — Min-Lee Teng; Litron Patent & Trademark Office

(57) ABSTRACT

The invention discloses a package structure with at least one portion of a first conductive element disposed in a through-opening of a first substrate. A conductive structure is disposed on the first substrate and the first conductive element, wherein the conductive structure is electrically connected to the first substrate and said at least one first I/O terminal of the first conductive element. The conductive structure comprises at least one of a second conductive element, a second substrate or a conductive pattern.

12 Claims, 12 Drawing Sheets

(56) References Cited

U.S. PATENT DOCUMENTS

| | | | |
|---|---|---|---|
| 8,072,004 B2* | 12/2011 | Ko et al. | 257/207 |
| 8,841,171 B2* | 9/2014 | Lin | H01L 25/16 438/118 |
| 2002/0017710 A1* | 2/2002 | Kurashima | H01L 21/76898 257/686 |
| 2002/0137255 A1* | 9/2002 | Wang | H01L 25/50 438/107 |
| 2004/0232533 A1* | 11/2004 | Hatakeyama | B81B 7/007 257/678 |
| 2004/0264533 A1* | 12/2004 | Matsumura et al. | 372/45 |
| 2006/0211269 A1* | 9/2006 | Goto | H01L 21/76888 438/785 |
| 2008/0073792 A1* | 3/2008 | Hosseini | H01L 24/03 257/762 |
| 2008/0179745 A1* | 7/2008 | Hess | H01L 24/05 257/751 |
| 2008/0251917 A1* | 10/2008 | Chu et al. | 257/738 |
| 2009/0283895 A1* | 11/2009 | Kikuchi | H01L 23/5389 257/692 |
| 2009/0316373 A1* | 12/2009 | Kim | H01L 23/5389 361/764 |
| 2010/0140782 A1* | 6/2010 | Kim | H01L 23/5383 257/690 |
| 2011/0147932 A1* | 6/2011 | Trezza | H01L 21/6835 257/739 |
| 2012/0119388 A1* | 5/2012 | Cho | H01L 21/56 257/778 |
| 2012/0129298 A1* | 5/2012 | Lin | H01L 25/16 438/118 |
| 2013/0093069 A1* | 4/2013 | Lu | H01L 23/13 257/666 |
| 2014/0191419 A1* | 7/2014 | Mallik | H01L 25/0652 257/777 |

* cited by examiner

```
551 ─ DISPOSE A PAD ON THE TERMINAL OF THE
      CONDUCTIVE ELEMENT.
              │
              ▼
552 ─ FORM A FIRST METALLIC MATERIAL
      PERMEATING INTO THE PAD AND REACHING
      THE INTERFACE BETWEEN THE PAD AND THE
      TERMINAL OF THE CONDUCTIVE ELEMENT,
      WHEREIN THE FIRST METALLIC MATERIAL IS
      ELECTRICALLY CONNECTED TO THE TERMINAL
      OF THE CONDUCTIVE ELEMENT AND
      ENCAPSULATES AT LEAST ONE PORTION
      OF THE PAD.
              │
              ▼
553 ─ FORM AN INSULATING MATERIAL ON THE
      CONDUCTIVE ELEMENT, WHEREIN THE
      INSULATING MATERIAL HAS A THROUGH-HOLE
      THEREIN, AND THE PAD IS DISPOSED ON THE
      BOTTOM OF THE THROUGH-HOLE.
              │
              ▼
554 ─ FORM A SECOND METALIC MATERIAL ON THE
      INSULATING MATERIAL AND FILLED IN THE
      THROUGH-HOLE.
```

FIG. 5

PACKAGE STRUCTURE AND THE METHOD TO FABRICATE THEREOF

BACKGROUND OF THE INVENTION

I. Field of the Invention

The present invention relates to a package structure and, in particular, to a package structure with a conductive element disposed in the through-opening of the substrate.

II. Description of the Prior Art

Lead frame is a material for IC package and can be in variety of forms such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which are wire bond, molding of IC chip, and the tests after trimming or forming. Various products can be made by integrating or packaging the lead frame with other devices such as inductors or capacitors. It's one of the main package processes in the industry due to its easiness, maturity and better reliability. However, such kind of conventional process has many disadvantages including: a. higher cost and more development works of molding devices; b. poor capability in area design which is only in the form of plane so that product size doesn't shrink; c. lacking of modular capability as it is only good for packaging a single device; and d. poor performance in heat dissipation and poor yield. Accordingly, the present invention proposes a package structure and its manufacturing method to overcome the above-mentioned disadvantages.

SUMMARY OF THE INVENTION

One objective of the present invention is to provide a package structure with at least one portion of a first conductive element disposed in a through-opening of a first substrate. The package structure comprises: a first substrate comprising a through-opening therein; a first conductive element having at least one first I/O terminal, wherein at least one portion of the first conductive element is disposed in the through-opening of the substrate; and a conductive structure disposed on the first substrate and the first conductive element, wherein the conductive structure is electrically connected to the first substrate and said at least one first I/O terminal of the first conductive element. The conductive structure comprises at least one of a second conductive element, a second substrate or a conductive pattern.

In one embodiment, a conductive pattern functioning as a conductive circuit can be formed on the top surface of the first substrate or the bottom surface of the first substrate. For electrical insulation, a dielectric material (e.g., an insulating material, a combination of a conductive material or a non-conductive material) can be disposed on the periphery of the first conductive element and the surface of the first substrate.

In one embodiment, a ball bonding, preferably a Sn ball, can be formed underlying the first substrate for external electrical connection (e.g., mounted on a PCB or electrically connected to another conductive element). In one embodiment, a better heat-dissipating material can be disposed on the bottom of the first conductive element so that the first conductive element has a better heat-dissipating path.

Moreover, dispensing or gluing is used to replace molding encapsulation for protection of the first conductive element. Therefore, it does not need additional development of molding devices; it can save time and cost; and it's easier for design. Compared with lead frame and molding in conventional structure of IC package, the structure can make the shortest electrical path for connecting the components so that it can reduce total impedance and increase electrical efficiency.

Another objective of the present invention is to provide a method for forming a package structure. The method comprises the steps of: providing a first substrate; forming a through-opening in the first substrate; disposing at least one portion of a first conductive element in the through-opening of the first substrate, wherein the first conductive element has at least one first I/O terminal; and forming a conductive structure on the first substrate and the first conductive element, wherein the conductive structure is electrically connected to the first substrate and said at least one first I/O terminal of the first conductive element.

One objective of the present invention is to provide a connecting structure for connecting to a conductive element having a terminal. The connecting structure comprises a pad disposed on the terminal of the conductive element; and a first metallic material permeating into the pad and reaching the interface between the pad and the terminal of the conductive element, wherein the first metallic material is electrically connected to the terminal of the conductive element and encapsulates at least one portion of the pad. In one embodiment, a metallic oxide exists in the interface between the pad and the terminal of the conductive element, wherein the first metallic material encapsulates at least one portion of the metallic oxide.

The first metallic material has a larger surface area adhering to the pad to increase the adhesive force between the conductive element and other metallic layers over the pad, thereby largely reducing the contact impedance of the interface between the pad and the terminal of conductive element. The shape of the first metallic material disposed on the pad can be spherical, elliptic, tear-shaped or irregular.

Preferably, the first metallic material can be formed on the pad by a wire-bond process to attach the first metallic material onto the pad, wherein the wire-bond process is ended without forming a conductive wire. The first metallic material can be also formed on the pad by any suitable process, such as laser, high pressure.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 5 is the process flow of manufacturing a connecting structure for connecting to a conductive element having a terminal in FIG. 4B to 4D.

DETAILED DESCRIPTION OF THE INVENTION

The detailed explanation of the present invention is described as following. The described preferred embodiments are presented for purposes of illustrations and description and they are not intended to limit the scope of the present invention.

The invention discloses a package structure with at least one portion of a conductive element disposed in a through-opening of a substrate. The package structure comprises: a first substrate comprising a through-opening therein; a first conductive element having at least one first I/O terminal, wherein at least one portion of the first conductive element is disposed in the through-opening of the substrate; and a conductive structure disposed on the first substrate and the first conductive element, wherein the conductive structure is electrically connected to the first substrate and said at least one first I/O terminal of the first conductive element.

The conductive structure comprises at least one of a second conductive element, a second substrate or a conductive pattern. The conductive structure can be a combination of a second conductive element, a second substrate or a conductive pattern as well. The second conductive element can be an IC chip, a MOSFET, an IGBT, a diode, a resistor, an inductor, a choke or a capacitor. The second substrate can be a PCB, a ceramic substrate, a metallic substrate or a lead frame. The conductive pattern can be formed by any suitable process such as film or printing process.

Embodiment 1

In the first preferred embodiment of the present invention, the conductive structure is a conductive pattern. Optionally, the conductive structure can be a combination of a conductive pattern and a second conductive element. Preferably, the conductive pattern is formed by any suitable process, such as film process or printing process.

Figure 1A:
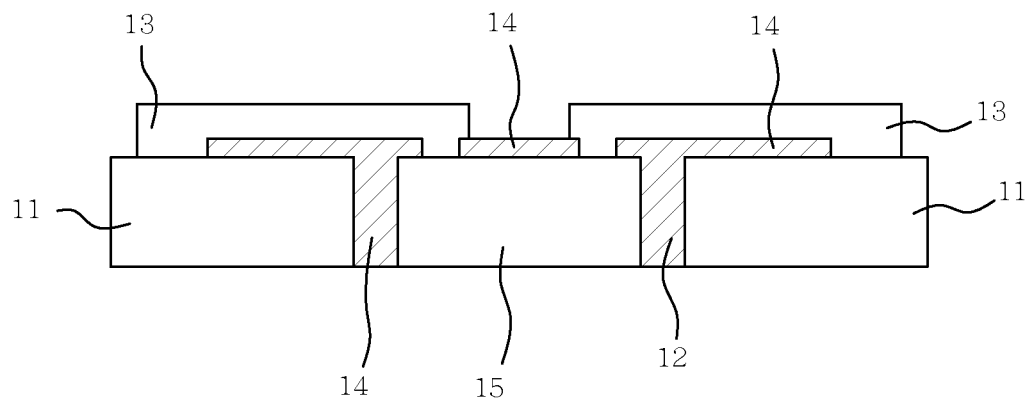
FIG. 1A illustrates a schematic cross-sectional view of the structure in the present invention.

FIG. 1A illustrates a schematic cross-sectional view of the structure 10 in accordance with the present invention. The structure 10 includes a first substrate 11, a through-opening 12, a conductive pattern 13, an insulating layer 14, and a first conductive element 15.

A first substrate 11 has a conductive pattern (not shown) therein and a plurality of pads (as I/O terminals) (not shown) for external electrical connections. In one embodiment, the pads can be placed in any suitable locations of the structure 10. The pads can be disposed underlying the first substrate 11 or on the conductive pattern 13 for making an optimized package structure. The first substrate 11 can be a PCB, a ceramic substrate, a metallic substrate, a lead frame, and so on. In one embodiment, the first substrate 11 is a metallic substrate so that the metallic substrate has a better heat-dissipating efficiency than PCB. In one embodiment, the first substrate 11 (such as a metallic substrate, a lead frame) has at least one vacancy (not shown). The vacancy can be filled with any suitable filling layer (not shown), such as an insulating layer. Appearance or shape of the first substrate 11 and the conductive pattern 13 depends on a layout of the pads via which the structure 10 is electrically connected to a PCB or another conductive element (not shown), such as IC chip, MOSFET, IGBT, diode, resistor, inductor, choke or capacitor. In one embodiment, the first substrate 11 comprises a plurality of sub-substrates, wherein the plurality of sub-substrates are joined together.

The first substrate 11 has at least one through-opening 12 therein. The through-opening 12 can be formed by removing one or more portions of the first substrate 11. In one embodiment, a conductive pattern 13 functioning as a conductive circuit can be formed on the top surface of the first substrate 11 (shown in FIG. 1A) or the bottom surface of the first substrate 11 (not shown). For electrical insulation, a dielectric material 14 (e.g., an insulating material, a combination of a conductive material or a non-conductive material) can be disposed on the periphery of the first conductive element 15 and the surface of the first substrate 11 (See FIG. 1A to 1D). At least one portion of the first conductive element 15 (e.g., IC chip, MOSFET, IGBT, diode, resistor, inductor, choke or capacitor) is disposed in the through-opening 12. At least one portion of the first conductive element 15 can be electrically connected to the conductive pattern 13 on the top surface of the first substrate 11 or the conductive pattern 13 on the bottom surface of the first substrate 11. In one embodiment, a heat-dissipating material can be disposed on the bottom of the first conductive element 15 so that the first conductive element 15 has a better heat-dissipating path.

There are many different ways to locate the through-opening 12: in one embodiment, the through-opening 12 is formed inside the first substrate 11; in another embodiment, the through-opening 12 is formed with one side aligned with one edge of the first substrate 11; in yet another embodiment, the through-opening 12 is formed with two sides aligned with two edges of the first substrate 11 respectively. In one embodiment, the through-opening 12 can be formed in the first substrate 11 which comprises a plurality of sub-substrates, wherein the plurality of sub-substrates are joined together.

In one embodiment, the first substrate 11 has at least one through-opening 12 and at least one recess (not shown) therein. The recess can be formed by removing one or more portions of the first substrate 11. At least one portion of the second conductive element (not shown) is located in the recess. There are many different ways to locate the recess: in one embodiment, the recess is formed inside of the first substrate 11; in another embodiment, the recess is formed with one side aligned with one edge of the first substrate 11; in yet another embodiment, the recess is formed with two sides aligned with two edges of the first substrate 11 respectively. In one embodiment, the recess can be formed in the first substrate 11 which comprises a plurality of sub-substrates, wherein the plurality of sub-substrates are joined together.

A conductive pattern 13 is disposed on the first substrate 11 and the first conductive element 15. The conductive pattern 13 is electrically connected to the first substrate 11 and said at least one first I/O terminal of the first conductive element 15. There can be a direct electrical connection between the first conductive element 15 and the first substrate 11. There can be also a non-direct electrical connection between the first conductive element 15 and the first substrate 11. In one embodiment (shown in FIG. 1A), the first conductive element 15 is electrically insulated from the first substrate 11 by filling an insulating layer 14 between the first conductive element 15 and the first substrate 11. In one embodiment, the conductive element 15 is electrically connected to the first substrate 11 via the conductive pattern 13.

Figure 1B:
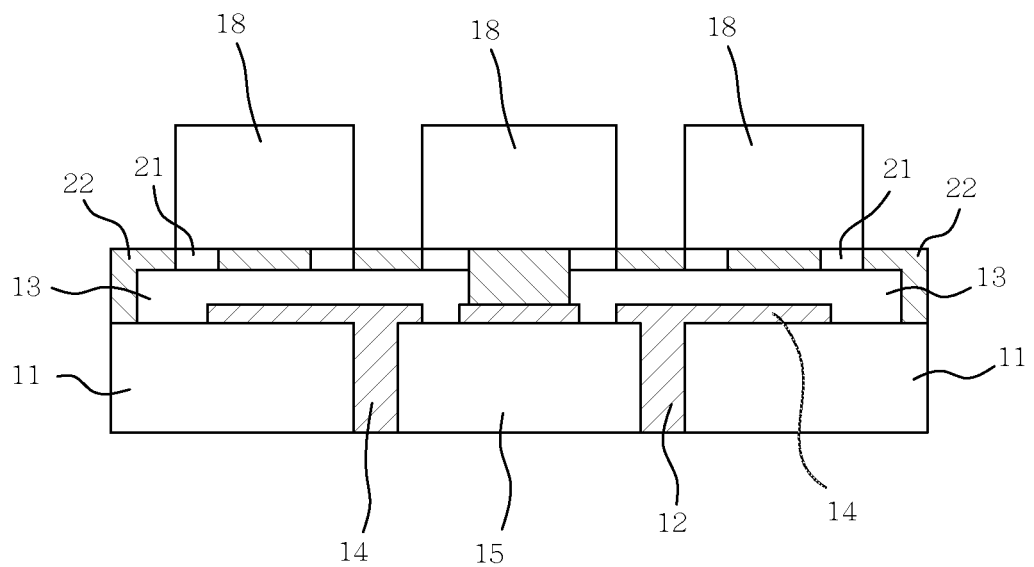
FIG. 1B illustrates a product structure having at least one second conductive element on the structure as shown in FIG. 1A.

FIG. 1B illustrates a product structure 20 having at least one second conductive element 18 on the structure 10 as shown in FIG. 1A. Compared to the structure 10 in FIG. 1A, the product structure 20 further includes at least one second conductive element 18 on the conductive pattern 13. A plurality of first pads 21 can be formed on the conductive pattern 13, and the second conductive element 18 (e.g., IC chip, MOSFET, IGBT, diode, resistor, inductor, choke or capacitor) can be disposed on the first pads 21. A first encapsulation material 22 can cover the conductive pattern 13. The first pads 21 can be made of any conductive material, such as Sn, Ni/Au or the like. In one embodiment, the first encapsulation material 22 and the insulating layer 14 can be made of the same material.

Figure 1C:
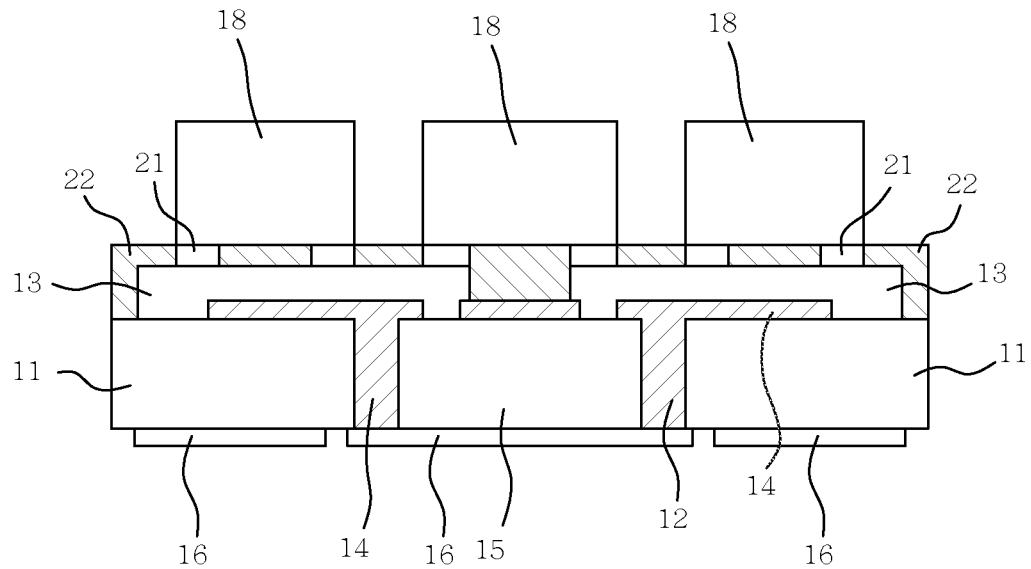
FIG. 1C illustrates another product structure having at least one second conductive element on the structure as shown in FIG. 1A, wherein a plurality of second pads can be disposed underlying the first substrate for external electrical connection.

FIG. 1C illustrates another product structure 30 having at least one second conductive element 18 on the structure 10 as shown in FIG. 1A, wherein a plurality of second pads 16 are disposed underlying the first substrate 11 for external electrical connection. The second pads 16 can be made of any conductive material, such as Sn, Ni/Au or the like. The structure 30 can be mounted on a PCB or electrically connected to another conductive element (not shown) (e.g., IC chip, MOSFET, IGBT, diode, resistor, inductor, choke or capacitor) so that the second conductive element 18 can be electrically connected to the PCB or another conductive element (not shown) via the conductive path encompassing the first pads 21, the conductive pattern 13, the first substrate 11 and the second pads 16. It should be noted that the way to make electrical connections varies with different kinds of products or process performed on the first substrate 11. It can be in many ways and is not limited to the ways described above. It can be readily appreciated by those skilled in the art and thus will not be further described herein.

Figure 1D:
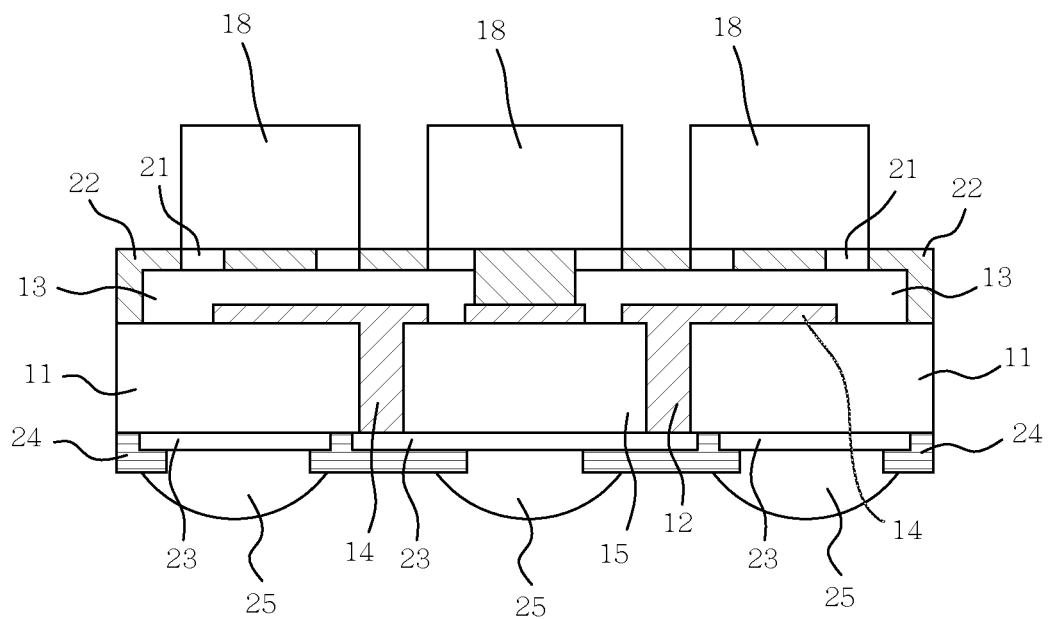
FIG. 1D illustrates yet another product structure having at least one second conductive element on the structure as shown in FIG. 1A.

FIG. 1D illustrates yet another product structure 40 having at least one second conductive element 18 on the structure 10 as shown in FIG. 1A. Compared with the structure 30 in FIG. 1C, a conductive layer 23 is disposed underlying the first substrate 11 (e.g., electroplating) and a second encapsulation material 24 (e.g., a solder mask) covers the conductive layer 23. A ball bonding 25 can be formed on the conductive layer 23 for external electrical connection. Preferably, the ball bonding 25 is a Sn ball. The structure 40 can be mounted on a PCB or electrically connected to another conductive element (not shown) (e.g., IC chip, MOSFET, IGBT, diode, resistor, inductor, choke or capacitor) so that the second conductive element 18 can be electrically connected to the PCB or another conductive element (not shown) via the conductive path encompassing the first pads 21, the conductive pattern 13, the first substrate 11, a conductive layer 23 and the ball bonding 25. It should be noted that the way to make electrical connections varies with different kinds of products or process performed on the first substrate 11. It can be in many ways and is not limited to the ways described above. It can be readily appreciated by those skilled in the art and thus will not be further described herein.

Figure 1E:
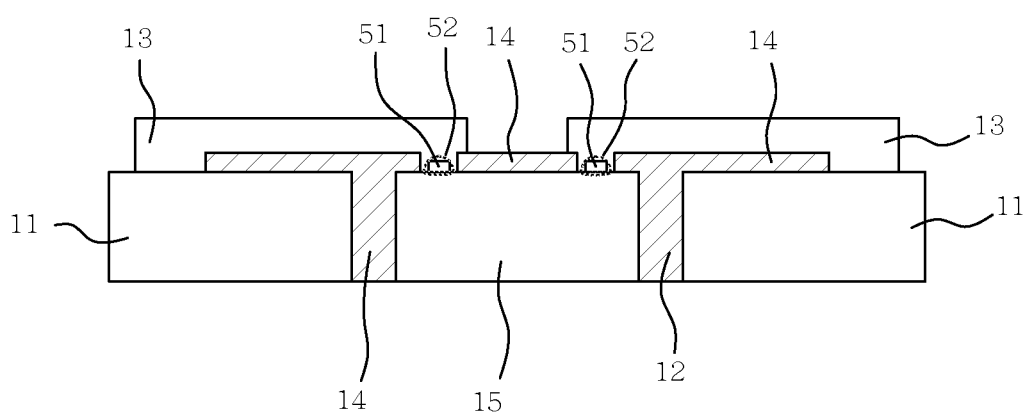
FIG. 1E illustrates a schematic cross-sectional view of another structure including a pad disposed on the terminal of the first conductive element and a first metallic material permeating into the pad and reaching the interface between the pad and the terminal of the first conductive element.

FIG. 1E illustrates a schematic cross-sectional view of another structure 50. Compared to the structure 10 in FIG. 1A, the product structure 50 further includes a pad 51 disposed on the terminal of the first conductive element 15 and a first metallic material 52 permeating into the pad 51 and reaching the interface between the pad 52 and the terminal of the conductive element 15, wherein the first metallic material 52 is electrically connected to the terminal of the first conductive element 15 and encapsulates at least one portion of the pad 51. Accordingly, the contact impedance of the interface between the pad 52 and the terminal of first conductive element 15 can be largely reduced.

Embodiment 2

In the second preferred embodiment of the present invention, the conductive structure is a second substrate. Optionally, the conductive structure can be a combination of a second substrate and a second conductive element.

FIG. 2A to 2D illustrates a schematic cross-sectional view of the structure 110, 120, 130, 140. The structure 110 mainly includes a first substrate 111, a through-opening 112, a second substrate 113, an insulating layer 114, and a first conductive element 115. Compared with the structure 10 in FIG. 1A, the conductive pattern 13 is replaced with a second substrate 113 having a conductive pattern 113A therein.

The second substrate 113 is disposed on the first substrate 111 (e.g., down set). The second substrate 113 comprises a conductive pattern 113A to electrically connect to the first substrate 111 and at least one I/O terminal of the first conductive element 115. The above-mentioned features in FIG. 1A to 1D can be applied to the structure 110, 120, 130, 140.

In one embodiment, the second substrate 113 can include a metallic plate, wherein the metallic plate is electrically coupled to one of the plurality of I/O pads of the structure 110, 120, 130, 140 and isolated from any of the conductive elements in the structure to reduce the interference from external electro-magnetic wave to the conductive elements.

The second substrate 113 can be a PCB, a ceramic substrate, a metallic substrate, a lead frame, and so on. In one embodiment, the second substrate 113 (such as a metallic substrate, a lead frame) has at least one vacancy (not shown). Appearance or shape of the first substrate 111 and the second substrate 113 depends on a layout of the pads via which the structure 110, 120, 130, 140 is electrically connected to a PCB or another conductive element (not shown), such as IC chip, MOSFET, IGBT, diode, resistor, inductor, choke or capacitor.

Because the conductive pattern 113A has been patterned in the second substrate 113 in an earlier predefined stage, it doesn't need complex patterning process, such as film process (lithography process) or printing process, to form a conductive pattern directly on the first substrate 111, wherein the conductive pattern 113A is electrically connected with at least one I/O terminal of the first conductive element 115, at least one I/O terminal of second conductive element 118 or the first substrate 111. Accordingly, it can save the cost of additional patterning process.

Figure 2A:
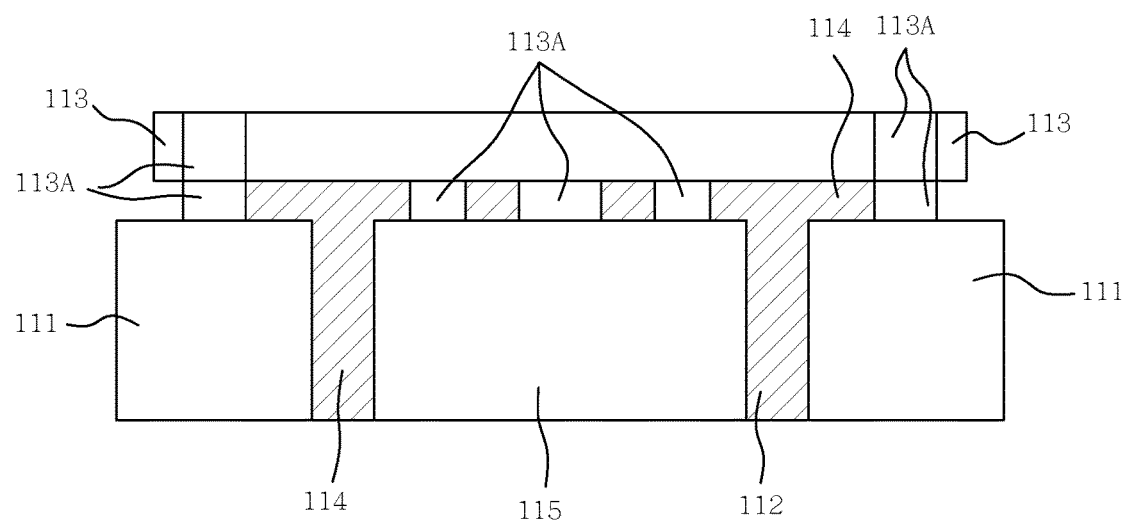
FIG. 2A to 2D illustrates a schematic cross-sectional view of the structure having a second substrate with which the conductive pattern in FIG. 1A is replaced.
Figure 2B:
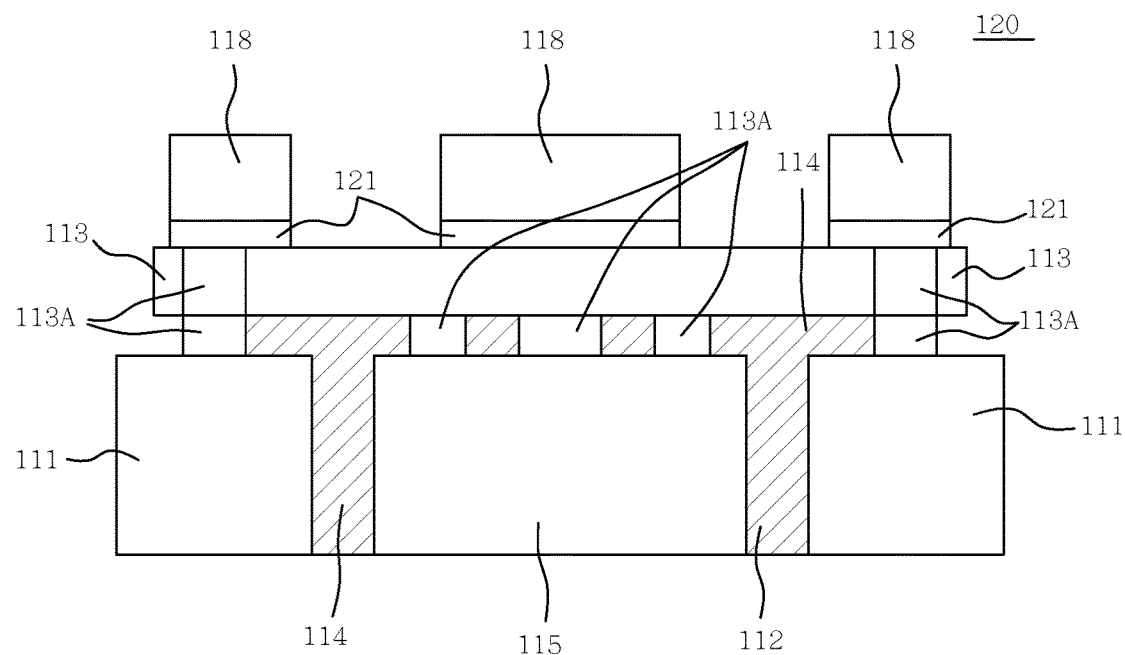
Figure 2C:
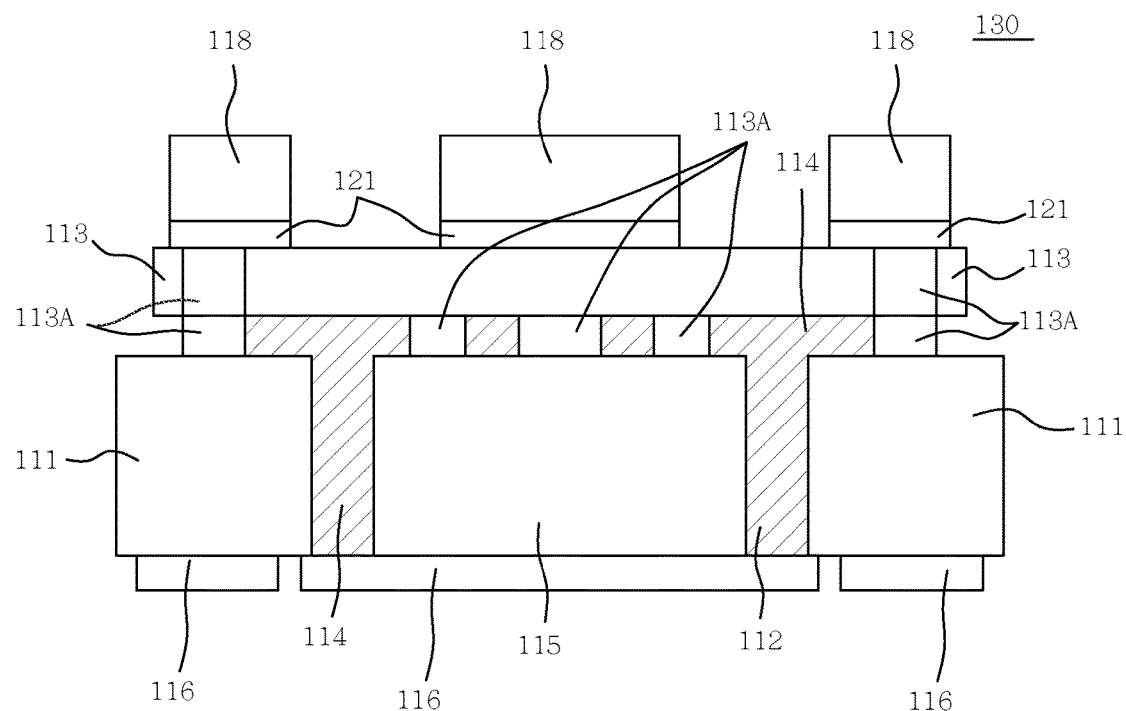
Figure 2D:
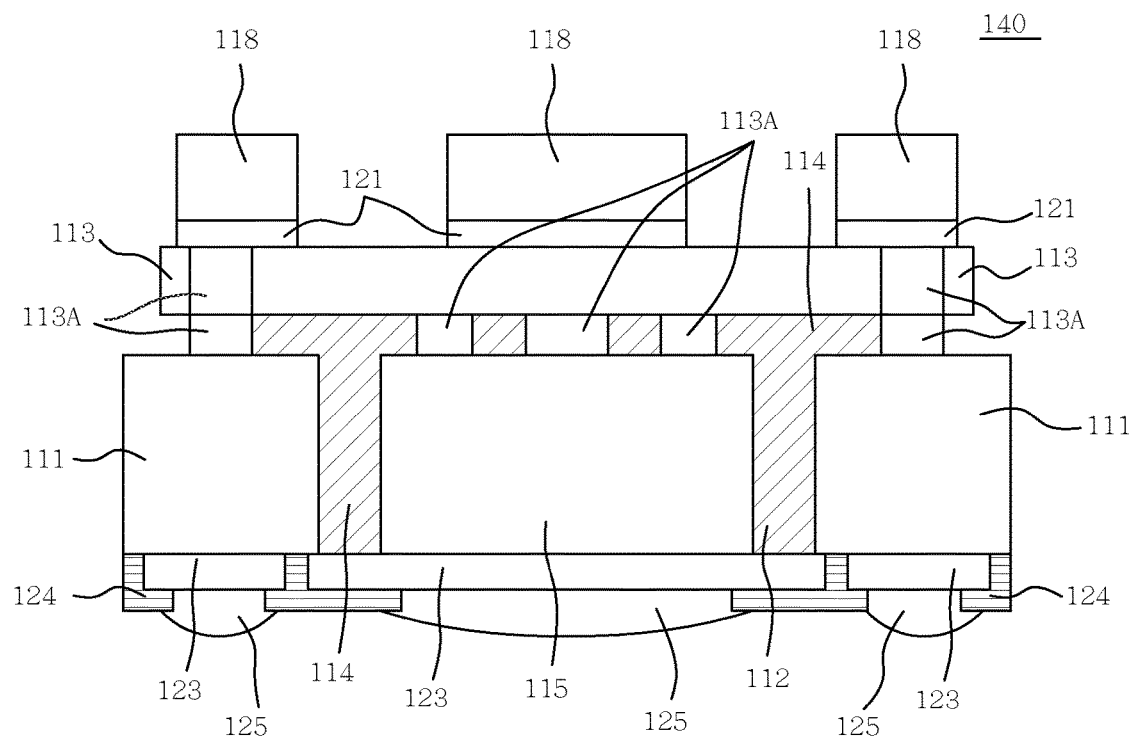
Figure 2E:
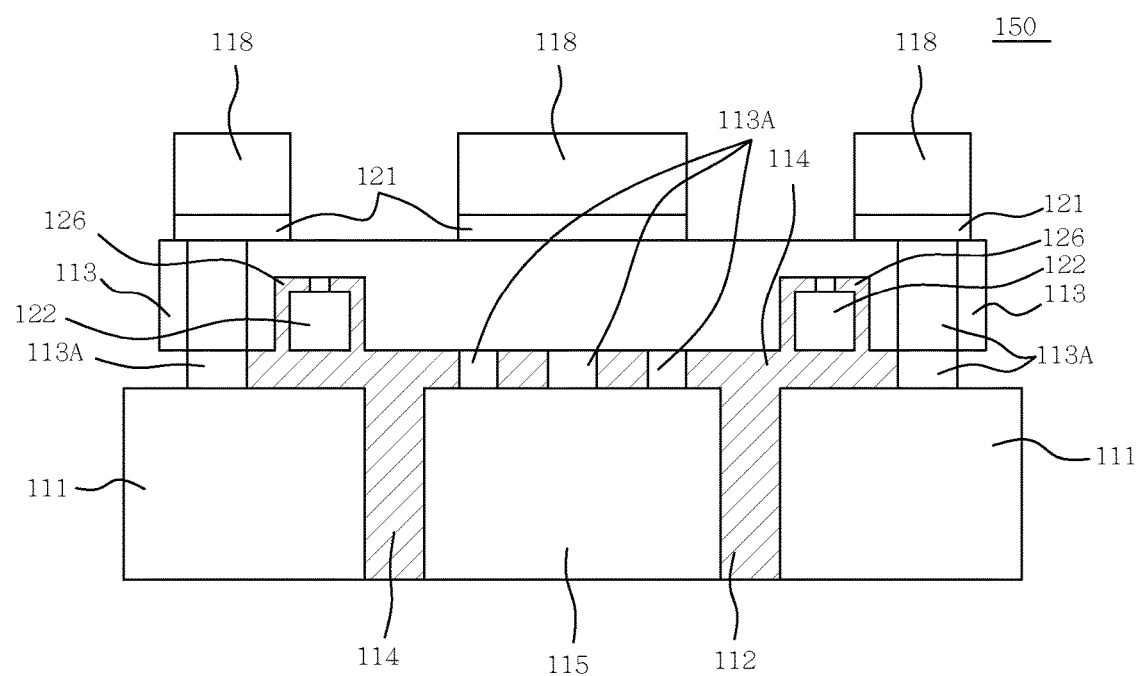
FIG. 2E illustrates another product structure having at least one third conductive element disposed in the vacancy of the second substrate.

FIG. 2E illustrates another product structure 150 having at least one third conductive element 122. Compared with the structure 120 in FIG. 2B, at least one third conductive element 122 is disposed in the vacancy (or recess) 126 of the second substrate 113. The third conductive element 122 can be a resistor. The features described above can also be applied to the structure 150 in FIG. 2E.

Figure 2F:
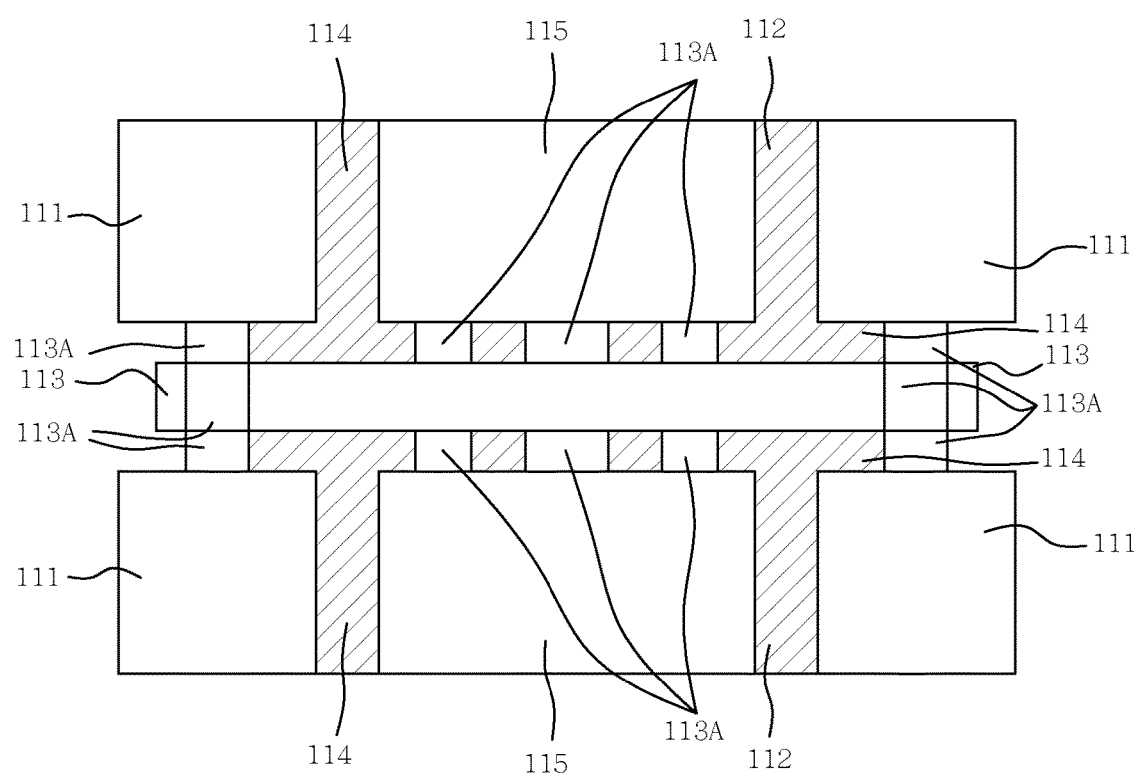
FIG. 2F illustrates a schematic cross-sectional view of the structure in the present invention, wherein the first substrates is disposed on the top surface and the bottom surface of the second substrate.

In one embodiment of the structure 160 in accordance with the present invention, as illustrated in FIG. 2F, the first substrates 111 can be disposed on the top surface and the bottom surface of the second substrate 112. There can be at least one through-opening 112 in which a conductive element 115 is disposed, in each of the first substrates 111 The features described above can also be applied to the structure 140 in FIG. 2F.

Figure 2G:
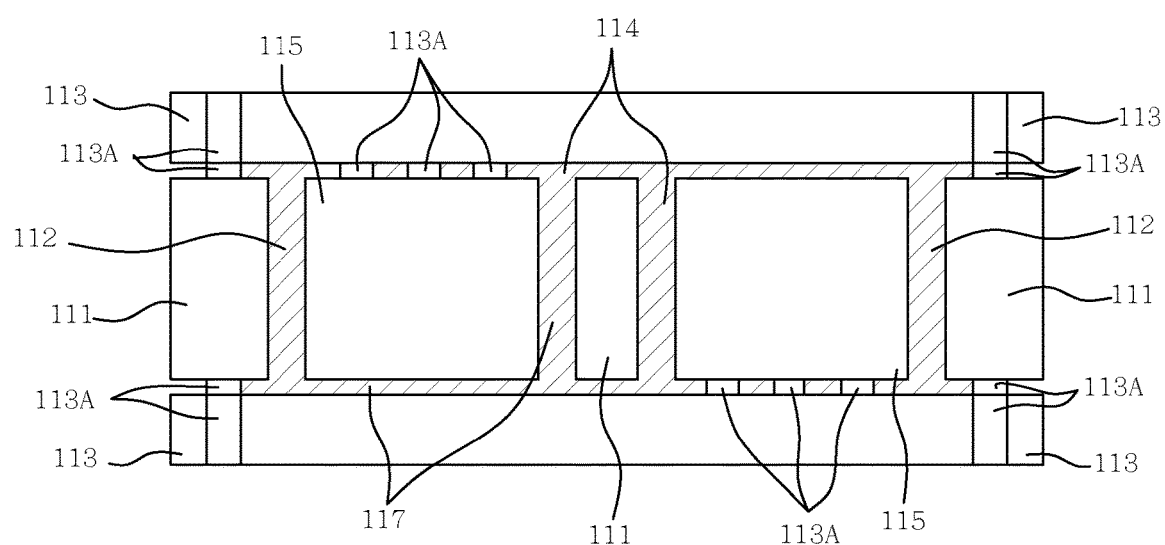
FIG. 2G illustrates a schematic cross-sectional view of the structure in the present invention, wherein the second substrate is disposed on the top surface and the bottom surface of the first substrate.

In another embodiment of the structure 170 in the present invention, as illustrated in FIG. 2G, the second substrates 113 can be disposed on the top surface and the bottom surface of the first substrate 111.

Figure 3:
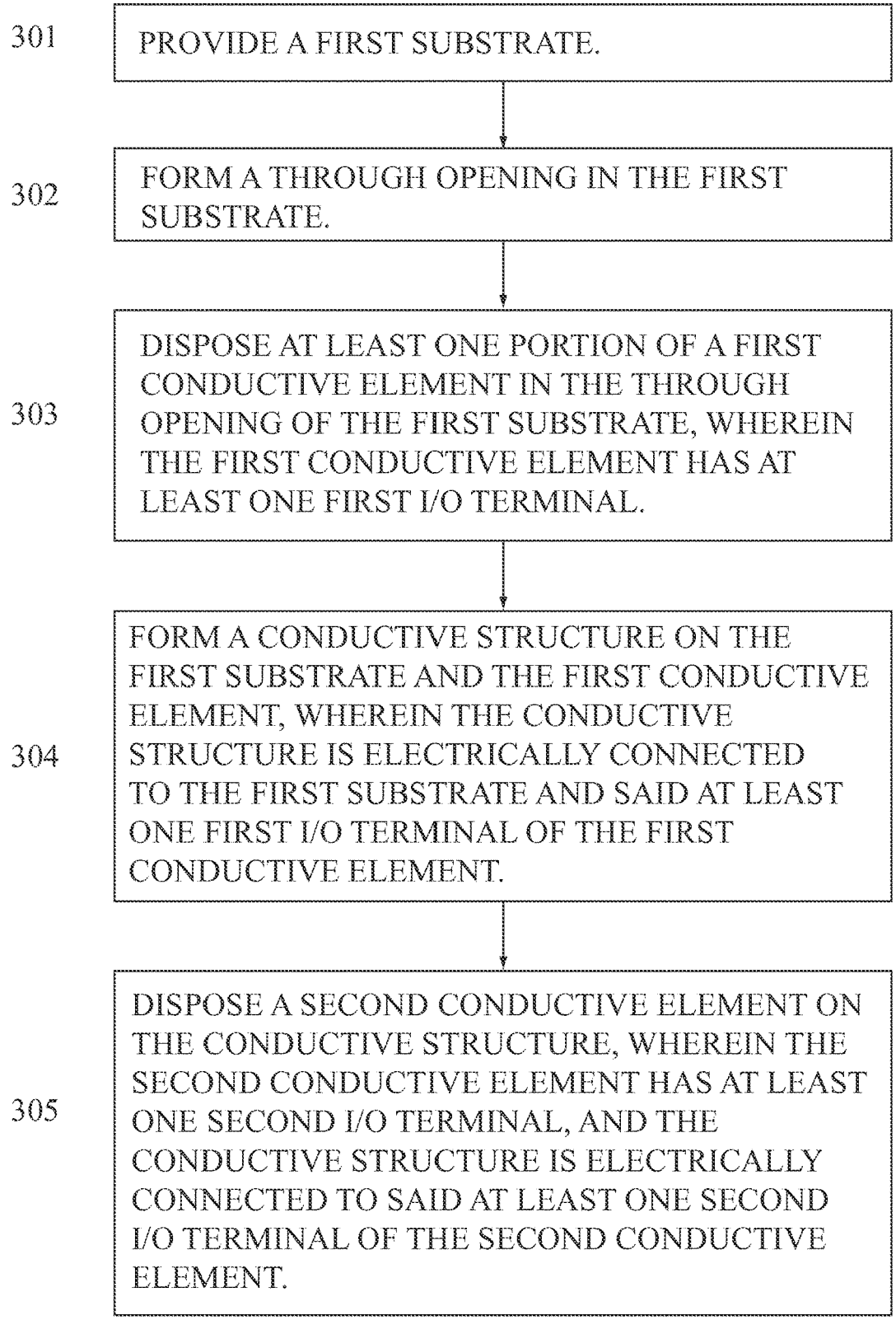
FIG. 3 is the process flow of manufacturing a package structure in FIG. 1A to 1D or in FIG. 2A to 2D.

FIG. 3 is the process flow of manufacturing a structure in FIG. 1A to 1D or in FIG. 2A to 2D.

In step 301, provide a first substrate 11, 111. The first substrate 11, 111 can be a PCB, a ceramic substrate, a metallic substrate, a lead frame, and so on.

In step 302, form a through-opening 12, 112 in the first substrate. The through-opening 12, 112 can be formed by known process. There are many different ways to locate the through-opening 12, 112; in one embodiment, the through-opening 12, 112 is formed inside the first substrate 11, 111; in another embodiment, the through-opening 12, 112 is formed with one side aligned with one edge of the first substrate 11, 111; in yet another embodiment, the through-opening 12, 112 is formed with two sides aligned with two edges of the first substrate 11, 111 respectively.

In step 303, dispose at least one portion of a first conductive element 15, 115 in the through-opening 12, 112 of the first substrate 11, 111, wherein the first conductive element 15, 115 has at least one first I/O terminal. The first conductive element 15, 115 can be an IC chip, a MOSFET, an IGBT, a diode, a resistor, an inductor, a choke or a capacitor.

In step 304, form a conductive structure 13, 113 on the first substrate 11, 111 and the first conductive element 15, 115, wherein the conductive structure 13, 113 is electrically connected to the first substrate 11, 111 and said at least one first I/O terminal of the first conductive element 15, 115. In one embodiment (see FIG. 1A to 1D), the conductive structure can a conductive pattern 13 formed by known process, such as film process, printing process or a combination thereof. A first encapsulation material 22 can cover the conductive pattern 13.

In step 305, dispose a second conductive element 18, 118 on the conductive structure 13, 113, wherein the second conductive element 18, 118 has at least one second I/O terminal, and the conductive structure 13, 113 is electrically connected to said at least one second I/O terminal of the second conductive element 18, 118. The second conductive element 18, 118 can be an IC chip, a MOSFET, an IGBT, a diode, a resistor, an inductor, a choke or a capacitor. Before the second conductive element 18, 118 is disposed on the conductive pattern 13, a first pad 21, 121 can be formed on the conductive structure 13, 113. A second pad 16, 116 can be disposed underlying the first substrate 11, 111 for external electrical connection to a PCB or another conductive element. The structure of the external electrical connection can be formed by known process, which has been described in FIG. 1C and FIG. 1D.

Conventionally, wire-bond is used to make electrical connection between the I/O terminal (e.g., Al pad) of the IC chip and the corresponding contact on the lead frame or any other conductive pattern thereof. The material of the wire used in wire-bond process comprises Au or Al. Besides, a metallic layer can be formed directly on the surface of the IC chip to make above electrical connection. They become main processes in the industry due to its easiness, maturity and better reliability. However, it still has many disadvantages including: a. the material between the contacts will degrade due to worse surface quality; b. the contact impedance will increase due to worse surface quality.

Figure 4A:
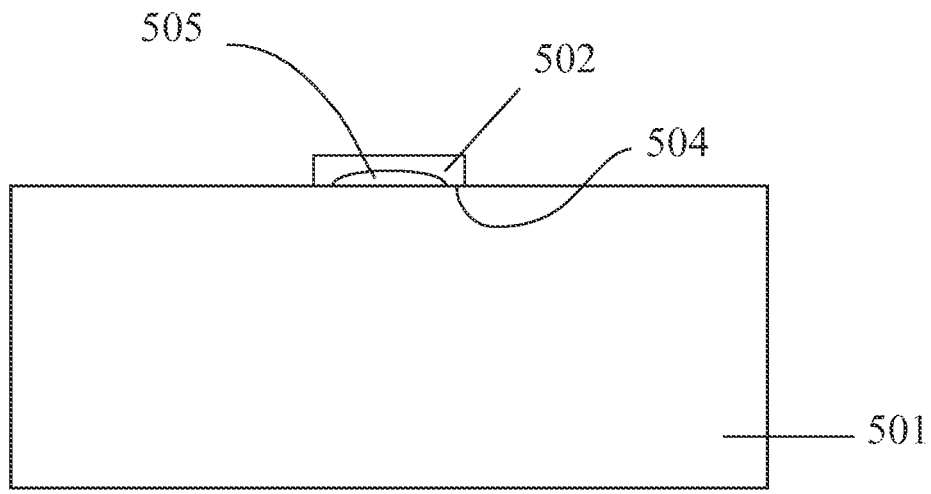
FIG. 4A illustrates a schematic cross-sectional view of the structure, wherein a metallic oxide exists in the interface between a pad and a terminal of a conductive element.

Please refer to FIG. 4A; a metallic oxide 505 exists in the interface 504 between a pad 502 and a terminal of a conductive element 501. The pad 502 (made of Al, Cr, and so on) easily suffers from oxidation. For example, if the pad 502 is made of Al, $Al_2O_3$ will be formed in the interface 504 between the pad 502 and the terminal of conductive element 501. $Al_2O_3$ has a thickness of about 200 angstrom. Optionally, the metallic oxide 505 can be removed by any suitable process, such as chemical cleaning or ultrasonic vibration. If the metallic oxide 505 is $Al_2O_3$ or $Cr_2O_3$, the removing ability of chemical cleaning is weaker than that of ultrasonic vibration. After forming a through-hole (not shown) on the pad 502, it's difficult to remove the metallic oxide 505 in the bottom of the through-hole and therefore the pollution will occur. Furthermore, the metallic oxides increases the contact impedance between the conductive element and the pad; and the electrical connection between the conductive element and the pad may even break due to the stress residue applied at the interface between the conductive element and the pad.

Figure 4B:
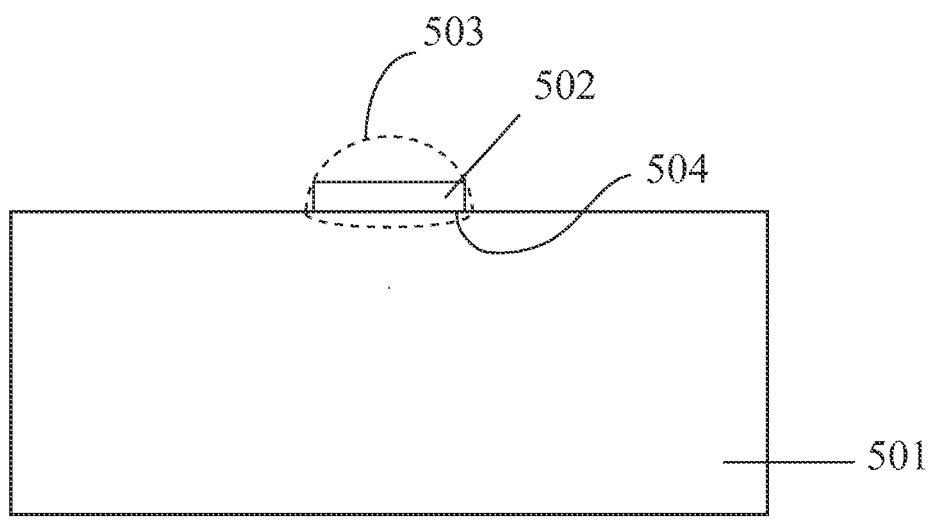
FIG. 4B illustrates a schematic cross-sectional view of the structure in the present invention.

The present invention also discloses a connecting structure for connecting to a conductive element having a terminal to solve above-mentioned problems. FIG. 4B illustrates a schematic cross-sectional view of the structure 500 which includes a conductive element 501, a pad 502 and a first metallic material 503. The conductive element 501 has a pad 502 thereon, and the first metallic material 503 permeates into the pad 502 and reaches the interface 504 between the pad 502 and the terminal of conductive element 501. The first metallic material 503 is electrically connected to the terminal of the conductive element 501 and encapsulates at least one portion of the pad 502. In one embodiment, please refer to FIG. 4C, a metallic oxide 505 exists in the interface 504 between the pad 502 and the terminal of the conductive element 501, wherein the first metallic material 503 encapsulates at least one portion of the metallic oxide 505.

Therefore, the contact impedance of the interface 504 between the pad 502 and the terminal of conductive element 501 can be largely reduced.

The first metallic material 503 can be any suitable material to reduce the contact impedance, such as Au, Ag, Cu, Sn or a combination thereof. The first metallic material 503 disposed on the pad 502 can have any suitable shape, so that the first metallic material 503 has a larger surface area to strongly adhere to the pad 502. The shape of the first metallic material 503 disposed on the pad 502 can be spherical, elliptic, tear-shaped or irregular. Accordingly, the adhesion force between the conductive element 501 and a second metallic material increases a lot.

The conductive element 501 can an IC chip, a MOSFET, an IGBT, a diode, a resistor, a choke or a capacitor. The structure 500 can be used in any complex structure; for example, as shown in FIG. 1E, a pad 51 is disposed on the terminal of the first conductive element 15, and a first metallic material 52 permeates into the pad 51 and reaches the interface between the pad 52 and the terminal of the first conductive element 15, wherein the first metallic material 52 is electrically connected to the terminal of the first conductive element 15 and encapsulates at least one portion of the pad 51. Preferably, the pad 502 is an Al pad and the conductive element 501 is a bare die.

In one embodiment (see FIG. 4D), the connecting structure 500 for connecting to a conductive element 501 having a terminal can be extended to electrically connect to a second metallic material 513. An insulating material 511 is disposed on the conductive element 501, wherein the insulating material 511 has a through-hole 511A therein, and the pad 502 is disposed on the bottom of the through-hole 511A. The insulating material 511 can include at least one of epoxy, oxide, a polymer-based material or a magnetic material. The diameter of the through-hole 511A has a width of about 40~300 μm. Preferably, the insulating material 511 can be a photoresist. The second metallic material 513 is disposed on the insulating material 511 and filled in the through hole 511A. The second metallic material 513 can be any suitable material, such as Cu, Ag or a combination thereof. In one embodiment, before the second metallic material 513 is formed, a thin metallic material 512 can be conformally deposited on the insulating material 511, the sidewall and bottom surface of the through-hole 511A. The thin metallic material 512 can be any suitable material, preferably Au.

Figure 4C:
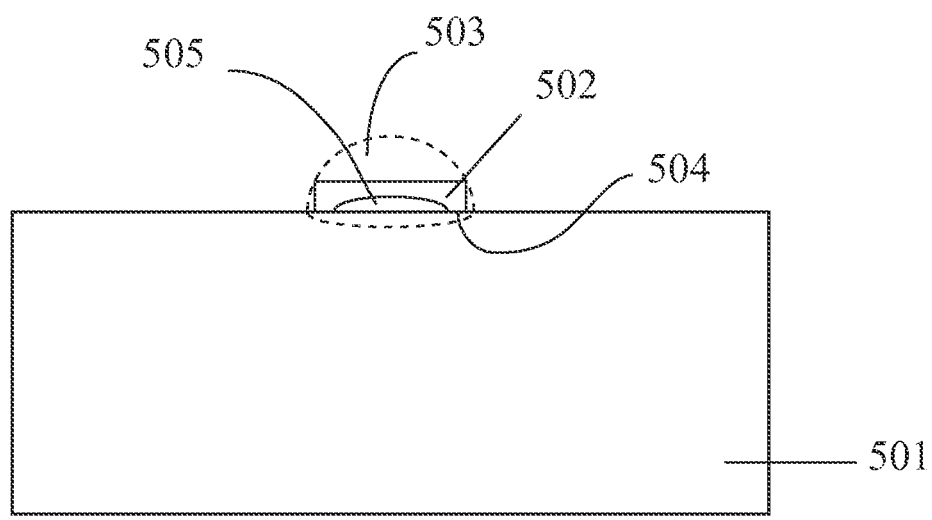
FIG. 4C illustrates a schematic cross-sectional view of the structure in the present invention, wherein a metallic oxide exists in the interface between the pad and the terminal of the conductive element.
Figure 4D:
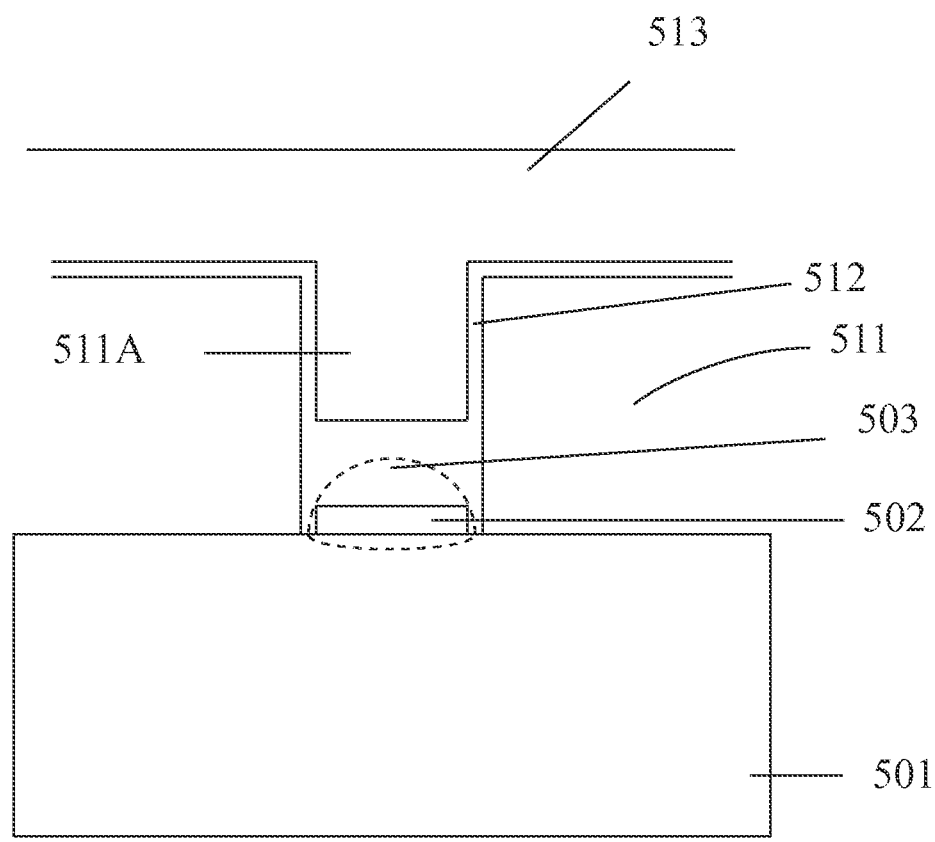
FIG. 4D illustrates a schematic cross-sectional view of the structure in the present invention, wherein the structure is extended to electrically connect a second metallic material.

FIG. 5 is the process flow of manufacturing a connecting structure 500 for connecting to a conductive element 501 having a terminal in FIG. 4B to 4D to further solve the problems, such as thermal expansion or unstable structure resulted from the structure in FIG. 4A.

In step 551, dispose a pad 502 on the terminal of the conductive element 501. Preferably, the pad 502 is an Al pad and the conductive element 501 is a bare die.

In step 552, form a first metallic material 503 permeating into the pad 502 and reaching the interface 504 between the pad 502 and the terminal of the conductive element 501, wherein the first metallic material 503 is electrically connected to the terminal of the conductive element 501 and encapsulates at least one portion of the pad 502. Preferably, the first metallic material 503 can be formed on the pad 502 by a wire-bond process to attach the first metallic material 503 onto the pad 502, wherein the wire-bond process is ended without forming a conductive wire. The first metallic material 503 can be also formed on the pad 502 by any suitable process, such as laser, high pressure.

In step 553, form an insulating material 511 on the conductive element 501, wherein the insulating material 511 has a through-hole 511A therein, and the pad 502 is disposed on the bottom of the through-hole 511A.

In step 554, form a second metallic material 513 on the insulating material 511 and filled in the through-hole 511A. The second metallic material 513 can be formed by known process, such as electroplating. In one embodiment, before the second metallic material 513 is formed, a thin metallic material can be conformally deposited on the insulating material 511, the sidewall and bottom surface of the through-hole 511A by known process, such as sputtering.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
   a first lead frame, having a top surface and a bottom surface and comprising a through-opening therein, wherein the through-opening is exposed from the top surface and the bottom surface of the first lead frame;
   a first electronic device, having at least one first I/O terminal on a top surface of the first electronic device, wherein at least one portion of the first electronic device is disposed in the through-opening of the first lead frame, wherein an insulating layer is disposed on the top surface of the first electronic device and the top surface of the first lead frame and extended into spaces between the first lead frame and the first electronic device in the through-opening;
   a conductive layer disposed on the insulating layer; and
   a second electronic device disposed above the top surface of the first lead frame and the top surface of the first electronic device, wherein the second electronic device is electrically connected to the first electronic device through the conductive layer, wherein a conductive pattern of the conductive layer electrically connects the first I/O terminal of the first electronic device to the top surface of the first lead frame through a via that is disposed in the insulating layer and located over the top surface of the first lead frame.

2. The package structure according to claim 1, wherein the first lead frame is not supported by a second substrate thereunder.

3. The package structure according to claim 1, further comprising a plurality of pads disposed underlying the first lead frame for electrically connecting with an external circuit.

4. The package structure according to claim 1, wherein the first lead frame further comprises a recess therein, further comprising a third electronic device having at least one third I/O terminal, wherein at least one portion of the third electronic device is disposed in the recess of the first lead frame, wherein the conductive pattern is electrically connected to said at least one third I/O terminal of the third electronic device.

5. The package structure according to claim 1, further comprising a heat-dissipating material disposed on the bottom of the first electronic device.

6. The package structure according to claim 1, wherein the top surface of the insulating layer is substantially at a same horizontal level, wherein the via extends from said horizontal level to the top surface of the first lead frame.

7. A connecting structure for connecting to an electronic device having a terminal, comprising:
- a pad disposed on the terminal of the electronic device; and
- a first metallic material permeating across the entire interface between the pad and the terminal of the electronic device, wherein the first metallic material is electrically connected to the terminal of the electronic device and encapsulates at least one portion of the pad.

8. The connecting structure according to claim 7, further comprising a metallic oxide in the interface between the pad and the terminal of the electronic device, wherein the first metallic material encapsulates at least one portion of the metallic oxide.

9. The connecting structure according to claim 7, wherein the shape of the first metallic material is spherical, elliptic, tear-shaped or irregular.

10. The connecting structure according to claim 7, further comprising:
- an insulating material disposed on the electronic device, wherein the insulating layer has a through-hole therein, and the pad is disposed on the bottom of the through-hole; and
- a second metallic material disposed on the insulating material extending to the through-hole.

11. The connecting structure according to claim 7, wherein the pad is made of Al and the electronic device is a bare die.

12. A method for forming a connecting structure for connecting to an electronic device having a terminal, comprising the steps of:
- disposing a pad on the terminal of the electronic device; and
- permeating a first metallic material across the entire interface between the pad and the terminal of the electronic device, wherein the first metallic material is electrically connected to the terminal of the electronic device and encapsulates at least one portion of the pad.

* * * * *